US006856214B2

(12) United States Patent
Jian et al.

(10) Patent No.: US 6,856,214 B2
(45) Date of Patent: Feb. 15, 2005

(54) SURFACE WAVE DEVICES WITH LOW PASSBAND RIPPLE

(75) Inventors: Chun-Yun Jian, Ottawa (CA); Steve A. Beaudin, Ottawa (CA); Somsack Sychaleun, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 53 days.

(21) Appl. No.: 10/315,134

(22) Filed: Dec. 10, 2002

(65) Prior Publication Data

US 2004/0108917 A1 Jun. 10, 2004

(51) Int. Cl.[7] .............................. H03H 9/42; H03H 9/64
(52) U.S. Cl. ...................... 333/154; 333/153; 333/195; 333/196; 310/313 B
(58) Field of Search ................................ 333/193–196, 333/150, 154, 153; 310/313 B

(56) References Cited

U.S. PATENT DOCUMENTS

| | | | | |
|---|---|---|---|---|
| 4,028,649 A | * | 6/1977 | Komatsu et al. | 333/194 |
| 4,599,532 A | * | 7/1986 | Okamoto et al. | 310/313 D |
| 4,600,905 A | * | 7/1986 | Fredricksen | 333/196 |
| 4,878,036 A | * | 10/1989 | Yatsuda et al. | 333/195 |
| 4,973,875 A | * | 11/1990 | Yatsuda | 310/313 D |
| 5,075,652 A | * | 12/1991 | Sugai | 333/193 |
| 5,831,494 A | * | 11/1998 | Solie | 333/193 |

FOREIGN PATENT DOCUMENTS

| | | | | |
|---|---|---|---|---|
| JP | 58-191513 | * | 11/1983 | 333/195 |
| JP | 4-288719 | * | 10/1992 | 333/193 |

OTHER PUBLICATIONS

David P. Morgan, Studies in Electrical and Electronic Engineering 19 "Surface–Wave Devices for Signal Processing" ElsElsevier Amsterdam–Oxford–New York–Tokyo 1991; pp 168 to 173.

C.C.W. Ruppel, L. Reindl, S. Berek, U. Knauer, P. Heide and M. Vossiek, "Design, Fabrication, and Application of Precise Delay Lines at 2.45 GHz", 1996 IEEE Ultrasonic Symposium, pp261 to 265.

* cited by examiner

*Primary Examiner*—Barbara Summons

(57) ABSTRACT

Very low passband ripple is provided in a wide bandwidth high frequency SAW FIR filter using slanted finger IDTs by one or more of three techniques: cancelling regenerated SAWs at parallel-connected input IDTs of two SAW filters which are similar except for a quarter-wavelength difference in spacing of the input and output IDTs, this difference varying with wavelength across the IDT aperture; shaping edges of shield electrodes to provide quarter-wavelength differences in, and hence cancellation of, SAWs reflected at the edges, the differences varying with wavelength across the IDT aperture; and making pairs of slanted shield electrodes symmetrical to compensate for refraction of SAWs by the shield electrodes.

12 Claims, 3 Drawing Sheets

SURFACE WAVE DEVICES WITH LOW PASSBAND RIPPLE

This invention relates to surface wave devices, and is particularly concerned with surface wave delay lines and filters with low passband ripple. The term "surface waves" is used herein to embrace various types of acoustic waves, including surface acoustic waves (SAWs), leaky SAWs, surface skimming bulk waves, and similar acoustic waves, and is abbreviated to SAW below. For brevity, in relation to SAW devices the term "filter" is used herein to embrace all types of SAW filter whether they are used primarily for filtering or as delay lines.

BACKGROUND OF THE INVENTION

As is well known, SAW devices provide significant advantages, such as low cost, small size, and desirable filter characteristics, in various filtering and delay applications, especially in wireless communications systems. However, such applications of SAW devices, particularly at frequencies above about 1 GHz (e.g. about 2 GHz or more) for current wireless communications systems, present stringent requirements which are not easily met.

For example, it would be desirable to be able to provide FIR (finite impulse response) SAW device filters having a very low passband ripple, e.g. less than 0.1 dB, over a relatively large fractional bandwidth, e.g. of the order of 10% or more, for operation at a high center frequency, e.g. of the order of 2 GHz. These requirements in combination are very difficult to meet.

A SAW devices for example comprises two interdigital transducers (IDTs) which are spaced from one another on a surface of a piezoelectric material for propagation of SAWs between them. To facilitate providing a relatively large fractional bandwidth, it is known to provide a SAW device with IDTs in which the fingers are slanted in order to provide a changing SAW wavelength, and hence a changing center frequency for SAW propagation, across the aperture of the SAW device (i.e. over the lengths of the fingers of the IDTs). The slant may be linear, hyperbolic, or in accordance with some other function, and may be continuous or stepped over the lengths of the fingers. In the latter case, each finger can comprise a plurality of segments, each constituting a part of the length of the finger and hence extending over a part of the aperture of the IDT, with each segment being perpendicular to the SAW propagation path. In any event, in a SAW device with a slanted IDT different frequencies within the passband correspond to different tracks, or SAW propagation paths, across the aperture of the IDT.

Slanted IDTs and SAW devices using them, having such slanted finger geometries, may alternatively be referred to as tapered IDTs because of the overall shape of the IDTs.

A significant factor contributing to passband ripple is triple transit interference (TTI). A SAW generated at one of the IDTs, constituting an input IDT, is propagated to the other IDT, constituting an output IDT, to provide a desired signal at the output IDT. Regeneration at the output IDT produces an "electronically reflected" SAW which is propagated back to the input IDT. Regeneration of this at the input IDT produces a further SAW which is propagated to the output IDT to constitute TTI, resulting in passband ripple at the third harmonic. Such regeneration continues, with decreasing amplitudes, at higher odd harmonics.

It is observed that this regeneration which results in TTI as described above is distinct from mechanical reflection of SAWs by the IDT fingers, which can be compensated for by using bifurcated or split fingers in known manner.

It is well known to reduce TTI by using IDTs which propagate SAWs predominantly or entirely in one direction. An example of a unidirectional IDT is the SPUDT (single phase unidirectional transducer). However, SPUDTs have narrower fingers, and hence require a greater resolution, than typical bidirectional IDTs, and limits of photolithographic techniques make manufacture of SPUDT SAW devices for operation at frequencies above about; 1 GHz, e.g. of the order of 2 GHz, impossible or impractical. For example, using 128° Y-X $LiNbO_3$ (lithium niobate) as the piezoelectric material, the narrowest finger or gap width for a SPUDT having a center frequency of 1.5 GHz would be about 0.33 $\mu$m; it is not practical to manufacture SAW devices with such a finger or gap width using existing SAW fabrication facilities.

It is known from "Surface-Wave Devices for Signal Processing" by David P. Morgan, Elsevier, 1991, pages 168–178 at 171 to reduce TTI by providing two SAW filters con the same substrate, connecting the input IDTs of the two SAW filters together, one output IDT being connected to a dummy load and the other providing an output of the SAW device. The SAW propagation paths of the two SAW filters differ by $\lambda/4$ where $\lambda$ is the SAW wavelength at the center frequency of the SAW device, whereby regeneration of SAWs at the input IDTs is suppressed because their have opposite phase. However, this is true only at this one center frequency, and TTI remains for other frequencies across the passband of the SAW device.

Typically grounded shield electrodes are provided in the SAW propagation path between the input and output IDTs of a SAW device, in order to reduce electromagnetic feedthrough between the IDTs. The shield electrodes partially reflect SAWs propagated between the IDTs, and reflected SAWs returned to the IDTs also contribute to passband ripple.

To avoid returning these reflected SAWs to the IDTs, it is known to use angled or slanted shield electrodes to reflect the SAWs at an angle. However, the present inventors have recognized that angled shield electrodes result in a refraction of the propagated SAWs, which for a slanted IDT results in an offset of the SAW frequency tracks which still contributes to passband ripple. For both slanted IDTs and conventional IDTs (i.e. non-slanted IDTs with fingers perpendicular to the SAW propagation path), the use of angled shield electrodes results in increased loss due to refraction of SAWs at the edges of the aperture of the IDTs.

Accordingly, a need exists to provide improved high frequency SAW devices with low passband ripple.

SUMMARY OF THE INVENTION

According to one aspect, this invention provides a SAW (surface wave) device comprising: a first input IDT (interdigital transducer) and a first output IDT forming a first SAW filter, at least one of the IDTs of the first SAW filter having a slanted finger geometry for SAWs at a plurality of different wavelengths over an aperture of the IDT; and a second SAW filter comprising a second input IDT and a second output IDT; wherein the second SAW filter is similar to the first SAW filter except that it provides a 180 degree phase change, relative to the first SAW filter, for SAWs regenerated at the output IDT and returned to the input IDT, said 180 degree phase change being provided respectively for said plurality of different wavelengths; the second input IDT being connected in parallel with the first input IDT so that said regenerated SAWs substantially cancel one another at the input IDTs for said plurality of wavelengths over said aperture.

Preferably the 180 degree phase change is provided by changing a spacing of the IDTs of the second SAW filter, relative to a spacing of the IDTs of the first SAW filter, by a quarter of the wavelength, or an odd multiple thereof, of the SAW at each respective one of said plurality of different wavelengths over said aperture, a difference between the spacings between the IDTs of the first and second SAW filters varying in dependence upon the SAW wavelength across said aperture.

Each SAW filter can include a shield electrode between the input IDT and the output IDT, at least one edge of said shield electrode being slanted or stepped so that SAW reflections at said edge from different positions across the aperture have substantially 180 degree phase differences between them, whereby said reflections are substantially cancelled at said plurality of different wavelengths, a slant or step size of said edge varying in dependence upon the SAW wavelength across said aperture. Conveniently said at least one edge of said shield electrode is stepped across the aperture with adjacent steps being displaced from one another, in the direction of SAW propagation, by about one quarter of the SAW wavelength, or an odd multiple thereof, at each respective one of the steps.

Each SAW filter can further include a second shield electrode between the input IDT and the output IDT, the two shield electrodes being substantially symmetrical about a central line between them and perpendicular to the SAW propagation path.

Another aspect of the invention provides a SAW (surface wave) device comprising: an input IDT (inter-digital transducer), and an output IDT for receiving SAWs from the input IDT, at least one of the input and output IDTs having a slanted finger geometry for SAWs at a plurality of different wavelengths over an aperture of the IDTs; and a shield electrode between the input IDT and the output IDT; wherein at least one edge of the shield electrode is slanted or stepped so that SAW reflections al said edge from different positions across the aperture have substantially 180 degree phase differences between them, whereby said reflections are substantially cancelled at said plurality of different wavelengths, a slant or step size of said edge varying in dependence upon the SAW wavelength across said aperture.

A further aspect of the invention provides a SAW (surface wave) device comprising: an input IDT (inter-digital transducer), and an output IDT for receiving SAWs from the input IDT; and two shield electrodes arranged successively in a SAW propagation path between the input IDT and the output IDT; wherein each of the two shield electrodes is slanted across an aperture of the IDTs, and the two shield electrodes are substantially symmetrical about a central line between them and perpendicular to the SAW propagation path. Preferably in this case at least one of the input and output IDTs has a slanted finger geometry for SAWs at a plurality of different wavelengths over said aperture.

BRIEF DESCRIPTION OF THE DRAWINGS

The invention will be further understood from the following description with reference to the accompanying drawings, in which the same reference numbers are used in different figures to refer to corresponding elements, and in which diagrammatically and by way of example.

DETAILED DESCRIPTION

Figure 1:
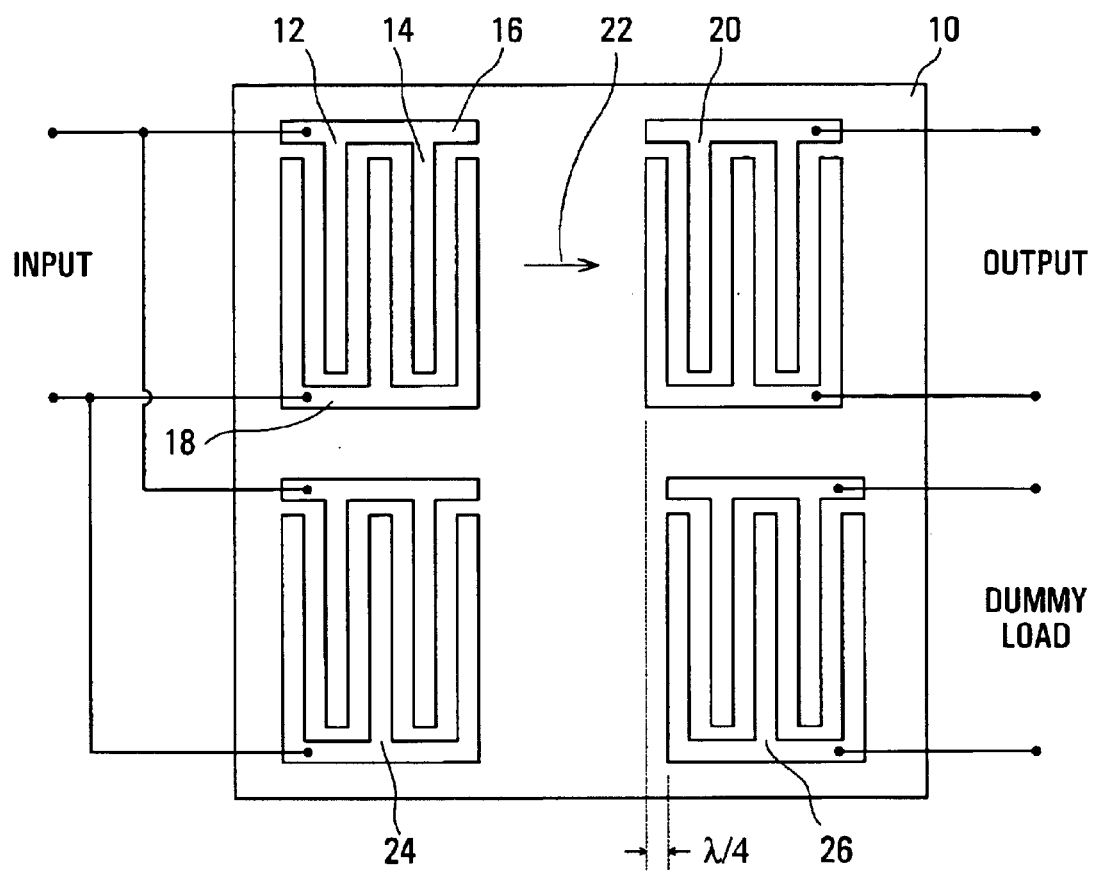
FIG. 1 illustrates a SAW device in which a known arrangement of IDTs is used to reduce TTI.

Referring to the drawings, each of the figures illustrates an arrangement of IDTs and, in some cases, shield electrodes which are provided on a surface of a piezoelectric material 10, in the plane of each figure, to constitute a SAW device. For simplicity and clarity in the drawings, each of the IDTs is illustrated as having only 5 electrodes or fingers, and input and output IDTs are shown as being the same as one another. It can be appreciated that these figures are provided for the purposes of illustrating and explaining principles of the invention. In practice the IDTs can comprise many fingers with different configurations (e.g. they may use bifurcated fingers, weighting techniques such as apodization or withdrawal weighting, etc.) and the input and output IDTs can be different from one another. For example, in FIGS. 4 to 7 the output IDTs can be wide bandwidth non-slanted IDTs rather than slanted IDTs as shown. Generally, SAW devices in accordance with embodiments of this invention can also make use of any other desired SAW device techniques.

Referring to FIG. 1, a SAW device is illustrated with an arrangement of IDTs to reduce TTI in a manner known from the publication by Morgan referred to above. The SAW device comprises a first input IDT 12 on the piezoelectric material 10, the IDT 12 comprising fingers or electrodes 14 extending in a conventional interdigital manner from two bus-bars 16 and 18 connected to input terminals, and a first output IDT 20 in this case of similar form connected to output terminals, forming a SAW filter with a SAW propagated from the input IDT 12 to the output IDT 20 in the direction of an arrow 22.

As discussed above, TTI occurs with such a SAW filter due to regeneration in the output IDT 20 producing a reverse SAW in the opposite direction to the arrow 22, and regeneration of this at the input IDT 12 producing a further SAW in the direction of the arrow 22. In order to reduce this TTI, the SAW device of FIG. 1 includes a second SAW filter, comprising a second input IDT 24 arid a second output IDT 26 which are substantially the same as the IDTs 12 and 20 respectively, except that as shown in FIG. 1 there is a change of $\lambda/4$ in the SAW propagation path between the IDTs 24 and 26 compared with the SAW propagation path between the IDTs 12 and 20, where $\lambda$ is the wavelength of the propagated SAW at the center frequency of the passband of the SAW filter. The second input IDT 24 is connected to the input terminals in parallel with the IDT 12, and the second output IDT 26 is connected to a dummy load which matches a load at the output terminals.

The second SAW filter has substantially the same TTI characteristics as the first SAW filter, except that due to the $\lambda/4$ difference there is a phase difference of 180 degrees in the regenerated SAW propagated from the output IDT 26 to the input IDT 24, relative to the phase of the regenerated SAW propagated from the output IDT 20 to the input IDT 12. Consequently, at the center frequency the regenerated SAWs at the input IDTs 12 and 24 cancel one another, and ideally there is no further SAW regeneration at the input IDTs so that TTI is eliminated.

In practice, the extent to which TTI is removed by the SAW device of FIG. 1 is dependent upon the bandwidth of the SAW device, the 180 degree phase relationship at the input IDTs 12 and 24 only being precisely applicable to the center frequency for which the wavelength λ is selected. In the arrangement of FIG. 1, TTI reduction deteriorates with increasing bandwidth of the SAW device, so that this arrangement does not sufficiently reduce TTI to meet stringent low passband ripple requirements required of SAW devices with wide fractional bandwidth.

Figure 2:
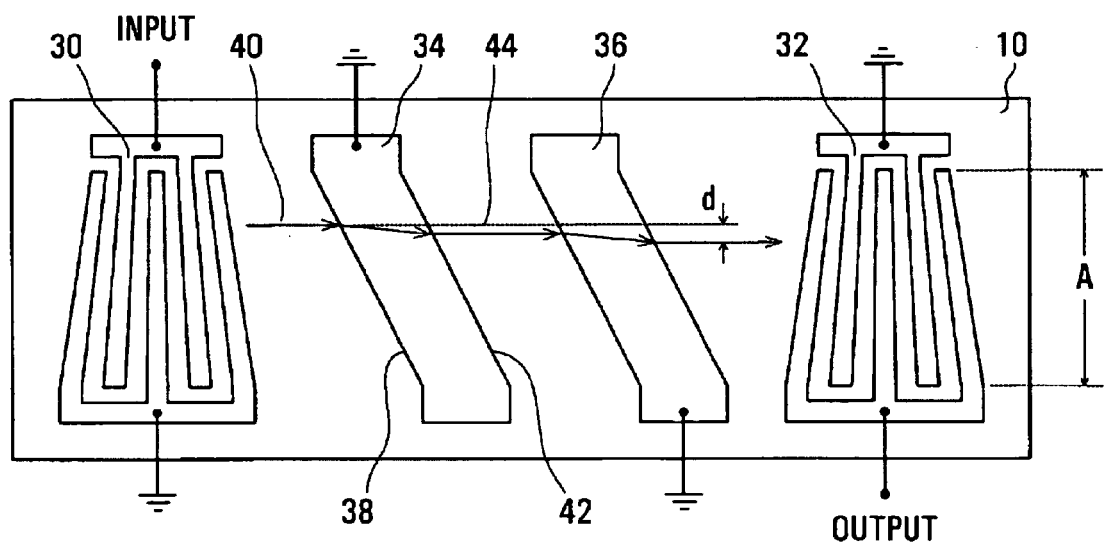
FIG. 2 illustrates a SAW device with slanted finger IDTs and a known arrangement of shield electrodes.

FIG. 2 illustrates another known SAW device having an input IDT 30 and an output IDT 32 with a relatively large fractional bandwidth. The SAW device of FIG. 2 also includes grounded shield electrodes 34 and 36 in the SAW propagation path between the input and output IDTs, and illustrates typical unbalanced input, output, and ground connections. The shield electrodes 34 and 36 serve to reduce electromagnetic feed-through between the input and output.

In the slanted IDTs 30 and 32 of FIG. 2, at points across the aperture A of the IDTs, i.e. over the lengths of the fingers or electrodes of the IDTs, the finger widths and spacings change so that a respective part of the aperture serves for a respective part of a wide frequency band of the SAW device. Thus the SAW device of FIG. 2 provides different parallel SAW propagation paths, or frequency tracks, across its aperture for different frequencies within its pass band, As shown in FIG. 2 the fingers are linearly tapered, but they could instead be non-linearly tapered or stepped for different parts of the frequency band.

As shown in FIG. 2, the shield electrodes 34 and 36 are also slanted or angled, so that SAWs reflected at their boundaries, such as an edge 38 of the shield electrode 34, are directed at a substantial angle to the SAW propagation path between the IDTs 30 and 32.

However, the present inventors have recognized that this results in refraction of the desired SAWs propagated between the IDTs 30 and 32. For example, a SAW propagated from the input IDT 30 at a certain point across the aperture A, as shown by an arrow 40, is refracted at the edge 38 of the shield electrode 34, and is returned to its original propagation direction at a subsequent edge 42, but it is displaced perpendicularly to its original propagation path represented by a dashed line 44 in FIG. 2. Similar refraction by the shield electrode 36 results in a total displacement d of the SAW from its original propagation path. Consequently, at the output IDT 36 this SAW is displaced from its original frequency track to a slightly different frequency track, and it can be appreciated that the same applies for SAWs at all frequencies in the passband of the SAW device. It can also be seen that at an edge of the aperture of the IDTs such displacement produces a loss of the desired SAW; such a loss also applies with angled shield electrodes whether or not the IDTs 30 and 32 have slanted finger geometry as shown in FIG. 2.

While the disadvantages (such as increased passband ripple) of this displacement of the propagated SAWs could conceivably be reduced by similarly displacing the output IDT 32 relative to the input IDT 30, an appropriate displacement may be difficult to provide in practice.

Figure 3:
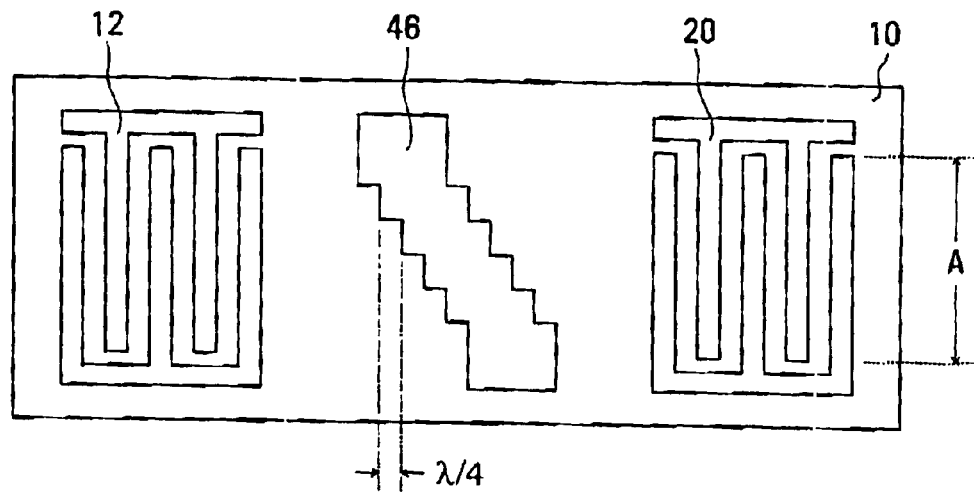
FIG. 3 illustrates a SAW device having non-slanted IDTs with a known stepped shield electrode between them.

FIG. 3 illustrates another known SAW device, having non-slanted IDTs 12 and 20 and a shield electrode 46 between them. In this SAW device the edges of the shield electrode 46 are stepped across the aperture A of the IDTs, adjacent steps all being displaced from one another in the direction of SAW propagation by a distance of λ/4 as shown in FIG. 3, where again λ is the wavelength of the propagated SAW at the center frequency of the passband of the SAW device. SAW reflections from the adjacent steps at an edge of the shield electrode 46 consequently have a phase difference of 180 degrees, and cancel one another, at the center frequency of the SAW device. However, this cancellation is increasingly less effective as the bandwidth of the SAW device is increased.

In order to provide SAW devices with very low passband ripple as is required for use in wireless communications systems at center frequencies above about 1 GHz and typically about 2 GHz, especially SAW devices with a relatively wide fractional bandwidth, it is necessary to avoid or reduce simultaneously the disadvantages of the known SAW devices of FIGS. 1 to 3. In accordance with embodiments of the invention, this is performed using the principles described below with reference to FIGS. 4 to 6 respectively.

Figure 4:
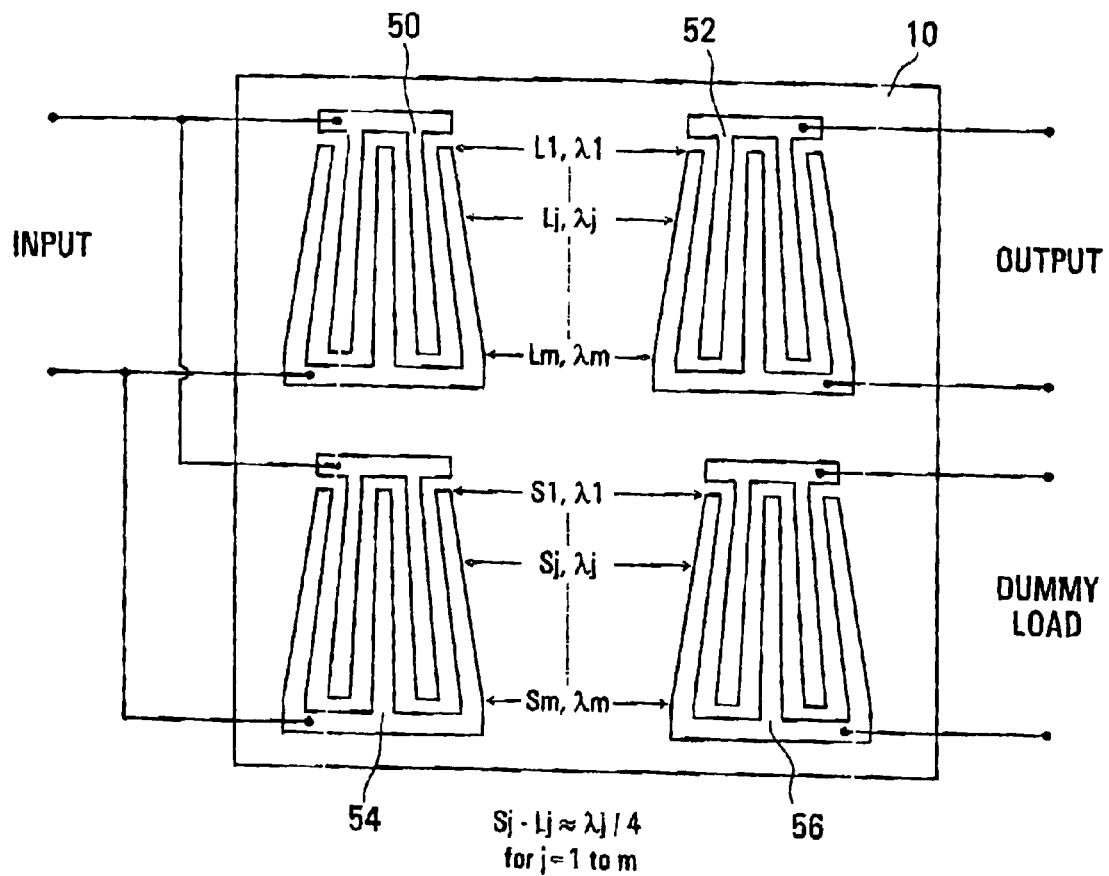
FIG. 4 illustrates a SAW device in accordance with one embodiment of this invention having an arrangement of slanted finger IDTs providing reduced TTI.

FIG. 4 illustrates a SAW device in accordance with one embodiment of this invention, comprising two SAW filters having input IDTs 50 and 54 connected in parallel to input terminals and having output IDTs 52 and 56 connected respectively to output terminals and to a dummy load (or a different load), in a generally similar manner to the IDTs 12, 20, 24, and 26 in the SAW device of FIG. 1. However, in the SAW device of FIG. 4 the IDTs 50, 52, 54, and 56 are slanted finger IDTs, similar to the IDTs 30 and 32 in the SAW device of FIG. 2.

Accordingly, the SAW filters in the SAW device of FIG. 4 provide different frequency tracks across the aperture of the IDTs, and these are denoted by respective wavelengths λj, j=1 to m, corresponding to the center frequencies of these frequency tracks. As shown in FIG. 4 the fingers of the IDTs are linearly tapered, but they could instead be non-linearly tapered or stepped for Different parts of the frequency band. Accordingly, the parameter j can be considered to be either continuous or stepped.

As shown in FIG. 4, a spacing Lj between the input IDT 50 and the output IDT 52 of the main SAW filter is different for different frequency tracks or wavelengths λj. Similarly, a spacing Sj between the input IDT 54 and the output IDT 56 of the additional SAW filter is different for different wavelengths λj. In addition, as indicated in FIG. 4, for each frequency track j and wavelength λj, i.e. for all values of j from 1 to m, a difference Sj−Lj of the respective spacings is made approximately equal to λj/4 (or an odd multiple of λj/4). Consequently, not only the spacings Lj and Sj but also their difference Sj−Lj is varied across the aperture of the IDTs in accordance with the respective frequency tracks or wavelengths λj.

As a result, whereas the SAW device of FIG. 1 substantially eliminates TTI for only the central frequency of the passband of the SAW device having the wavelength λ, for which the regenerated SAWs at the input transducers 14 and 24 have a phase difference of exactly 180 degrees, in the SAW device of FIG. 4 a phase difference of substantially 180 degrees between the regenerated SAWS at the input transducers 50 and 54 is established for each of the frequency tracks or wavelengths λ, and TTI is substantially cancelled individually for each frequency track or wavelength λ.

As a result, and especially for a SAW device with a relatively wide fractional bandwidth, the arrangement of the IDTs as illustrated by FIG. 4 provides improved TTI reduction over the passband of the SAW device.

Figure 5:
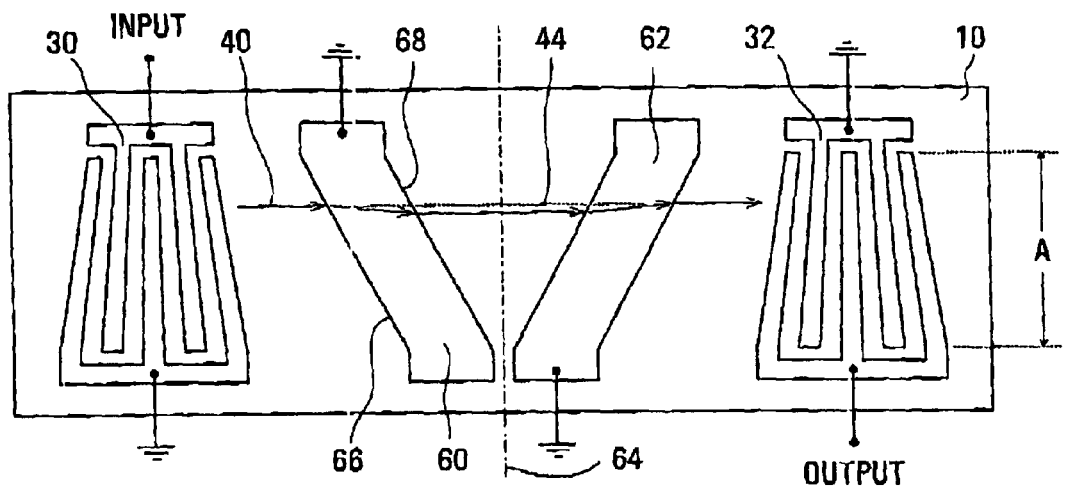
FIG. 5 illustrates a SAW device in accordance with another embodiment of this invention with slanted finger IDTs and shield electrodes.

FIG. 5 illustrates a SAW device in accordance with another embodiment of this invention. The SAW device of FIG. 5 is similar to that of FIG. 2 in that it comprises the input and output IDTs 30 and 32 with slanted finger geometry, and two slanted or angled grounded shield electrodes 60 and 62. The shield electrode 60 is similar to the shield electrode 34 in the SAW device of FIG. 2, but the shield electrode 62 is different from the shield electrode 36 in the SAW device of FIG. 2. More particularly, the shield electrode 62 (with the possible exception of its ground connection, as illustrated) is symmetrical to the shield electrode 60 about a central line 64 between the shield electrodes and perpendicular to the SAW propagation path of the IDTs.

Thus, in the SAW device of FIG. 5, a SAW propagated from the input IDT 30 at a certain point across the aperture A, as shown by the arrow 40, is refracted at an edge 66 of the shield electrode 60, and is returned to its original propagation direction at a subsequent edge 68, displaced perpendicularly to its original propagation path represented by the dashed line 44. The symmetrical arrangement results in similar refraction by the shield electrode 62 exactly cancelling this displacement to return the SAW to its original propagation path. The same applies for SAWs at all frequencies in the passband of the SAW device, and at the edges of the aperture of the IDTs thereby avoiding a loss due to the angled shield electrodes, whether or not the IDTs 30 and 32 have a slanted finger geometric as illustrated in FIG. 5.

Consequently, the symmetrical shield electrodes 60 and 62 in the SAW device of FIG. 5 not only reduce electromagnetic feedthrough as is desired, but also avoid the problem of refraction, and consequent passband ripple, due to the angle of the shield electrodes in the known SAW device of FIG. 2.

It can be appreciated that a symmetrical arrangement of an even number of four or more angled or slanted shield electrodes can be similarly provided between the input and output IDTs to provide increased feedthrough suppression and similar compensation fear refraction of SAWs in the individual shield electrodes.

Figure 6:
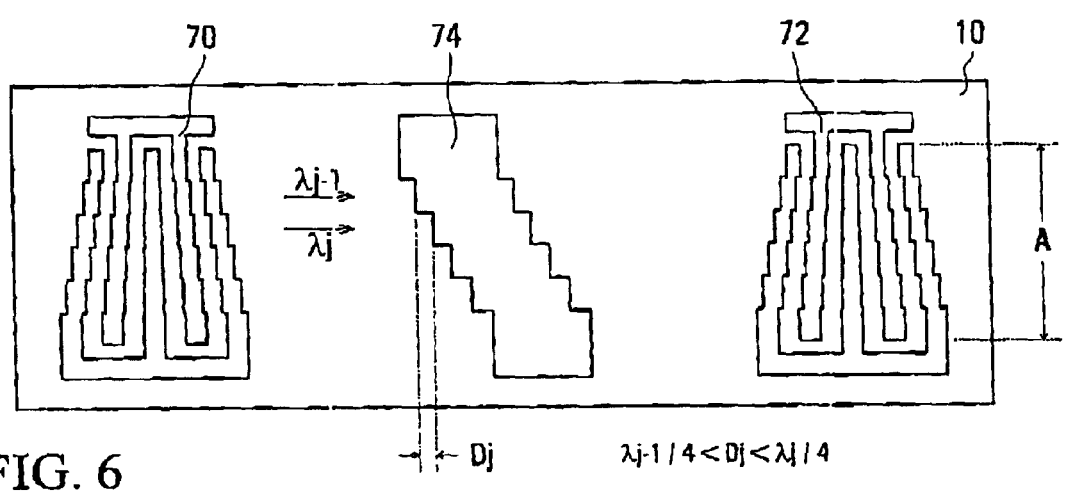
FIG. 6 illustrates a SAW device in accordance with a further embodiment of this invention with slanted finger IDTs with a stepped shield electrode between them.

FIG. 6 illustrates a SAW device in accordance with a further embodiment of this invention. The SAW device of FIG. 6 is similar to that of FIG. 3 in that it comprises input and output IDTs 70 and 72 with slanted finger geometry, and a stepped shield electrode 74 between them. The slanted finger geometry of the IDTs 70 and 72 is in this case stepped to provide discrete frequency tracks with respective wavelengths, two of which are denoted by arrows and the respective wavelengths $\lambda j-1$ and $\lambda j$.

The steps of the shield electrode 74 in the SAW device of FIG. 6 are matched to the IDT steps, and hence the respective frequency tracks, over the aperture A of the IDTs, and are sized in accordance with these frequency tracks. More particularly, as illustrated in FIG. 6, for each frequency track, the step size Dj for the respective step of the shield electrode 74 is selected to be greater than one quarter of the wavelength $\lambda j-1$ of the adjacent higher frequency track, and less than one quarter of the wavelength $\lambda j$ of the respective frequency track. Consequently, whereas all of the steps of the shield electrode 46 in the known SAW device of FIG. 3 have the same size, the step size Dj for the steps of the shield electrode 74 in the SAW device of FIG. 6 changes fear the different frequency tracks over the aperture A.

Consequently, SAW reflections from adjacent steps at an edge of the shield electrode 74 have a phase difference of substantially 180 degrees, and substantially cancel one another, at the center frequency for each frequency track over the aperture A and hence over the passband of the SAW device of FIG. 6.

Although each of the techniques described above with reference to FIGS. 4 to 6 can be used individually, any two of them can be used together, and preferably they are all used together to provide a SAW device with desired characteristics. By way of example, FIG. 7 illustrates a SAW device in accordance with another embodiment of this invention in which the techniques or principles of the SAW devices of FIGS. 5 and 6 are combined.

Figure 7:
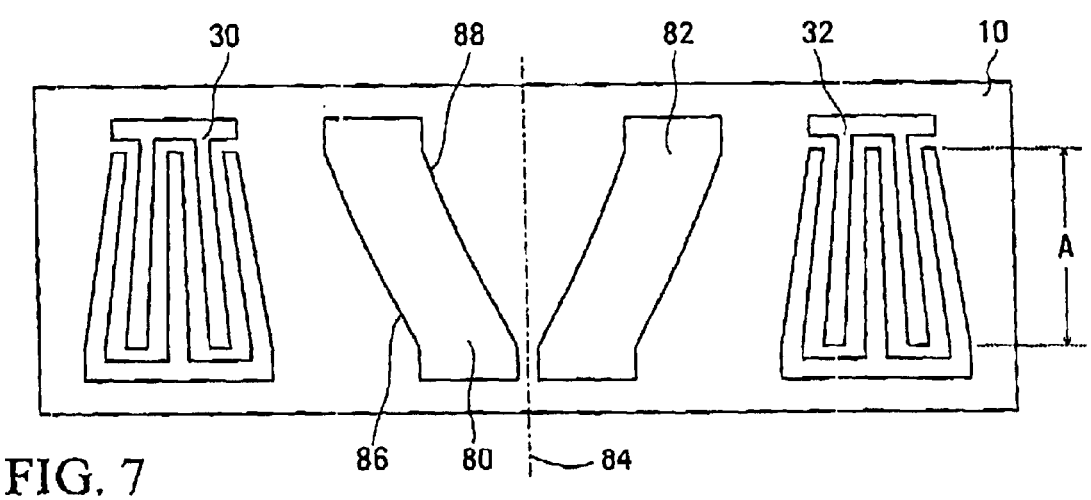
FIG. 7 illustrates a SAW device in accordance with another embodiment of this invention in which the principles of the SAW devices of FIGS. 5 and 6 are combined.

Referring to FIG. 7, the illustrated SAW device comprises input and output IDTs 30 and 32 with slanted finger geometry with linear tapers, and two slanted or angled grounded shield electrodes 80 and 82 which are symmetrical about a center line 84 between them and perpendicular to the SAW propagation path. Thus the SAW device of FIG. 7 has a similar general configuration to that of FIG. 5, with the symmetrical arrangement of the shield electrodes 80 and 82 compensating for refraction of the propagated SAWs by each of them.

Furthermore, in the SAW device of FIG. 7 each of the symmetrical shield electrodes 80 and 82 has edges 86 and 88, which in this case are continuous rather than being stepped, which are not straight but curve over the aperture of the IDTs in accordance with the technique described above with reference to FIG. 6. Accordingly, reflections of SAWs at these edges have a phase difference of substantially 180 degrees for all of the frequency tracks, and such reflections substantially cancel one another at all frequencies over the passband of the SAW device.

It can be appreciated that two SAW filters, each having the form of the SAW device of FIG. 7, can be provided on the same substrate of piezoelectric material 10 with their IDTs connected, and the spacings between the input and output IDTs of the two SAW filters arranged, in substantially the same manner as described above with reference to FIG. 4, to provide the SAW device with all of the advantages of the techniques described above.

It will also be appreciated that these techniques are applicable to SAW device filters generally, whether they are intended primarily for filtering or as delay lines.

Although particular embodiments of the invention are illustrated by way of example and are described in detail above, it can be appreciated that numerous modifications, variations, and adaptations may be made within the scope of the invention as defined in the claims.

What is claimed is:

1. A SAW (surface wave) device comprising:
   an input IDT (inter-digital transducer), and an output IDT for receiving SAWs from the input IDT, at least one of the input and output IDTs having a slanted finger geometry for SAWs at a plurality of different wavelengths over an aperture of the IDTs; and
   a shield electrode between the input IDT and the output IDT;
   wherein at least one edge of the shield electrode is slanted or stepped so that SAW reflections at said edge from different positions across the aperture have substantially 180 degree phase differences between them, whereby said reflections are substantially cancelled at said plurality of different wavelengths, a slant or step size of said edge varying in dependence upon the SAW wavelength across said aperture.

2. A SAW device as claimed in claim 1 wherein said at least one edge of the shield electrode is stepped across the aperture with adjacent steps being displaced from one another, in the direction of SAW propagation, by about one quarter of the SAW wavelength, or an odd multiple thereof, at each respective one of the steps.

3. A SAW device as claimed in claim 2 and further including a second shield electrode between the input IDT and the output IDT, wherein the two shield electrodes are substantially symmetrical about a central line between them and perpendicular to the SAW propagation path.

4. A SAW device as claimed in claim 1 and further including a second shield electrode between the input IDT and the output IDT, wherein the two shield electrodes are substantially symmetrical about a central line between them and perpendicular to the SAW propagation path.

5. A SAW (surface wave) device comprising:
   a first input IDT (inter-digital transducer) and a first output IDT forming a first SAW filter, at least one of the IDTs of the first SAW filter having a slanted finger geometry for SAWs at a plurality of different wavelengths over an aperture of the IDT; and
   a second SAW filter comprising a second input IDT and a second output IDT;
   wherein the second SAW filter is similar to the first SAW filter except that it provides a 180 degree phase change, relative to the first SAW filter, for SAWs regenerated at the output IDT and returned to the input IDT, said 180 degree phase change being provided respectively for said plurality of different wavelengths;
   the second input IDT being connected in parallel with the first input IDT so that said regenerated SAWs substantially cancel one another at the input IDTs for said plurality of wavelengths over said aperture;
   wherein said 180 degree phase change is provided by changing a spacing of the IDTs of the second SAW filter, relative to a spacing of the IDTs of the first SAW filter, by a quarter of the wavelength, or an odd multiple thereof, of the SAW at each respective one of said plurality of different wavelengths over said aperture, a difference between the spacings between the IDTs of the first and second SAW filters varying in dependence upon the SAW wavelength across said aperture;
   wherein each SAW filter includes a shield electrode between the input IDT and the output IDT, and at least one edge of said shield electrode is slanted or stepped so that SAW reflections at said edge from different positions across the aperture have substantially 180 degree phase differences between them, whereby said reflections are substantially cancelled at said plurality of different wavelengths, a slant or step size of said edge varying in dependence upon the SAW wavelength across said aperture.

6. A SAW device as claimed in claim 5 wherein said at least one edge of said shield electrode is stepped across the aperture with adjacent steps being displaced from one another, in the direction of SAW propagation, by about one quarter of the SAW wavelength, or an odd multiple thereof, at each respective one of the steps.

7. A SAW device as claimed in claim 6 wherein each SAW filter further includes a second shield electrode between the input IDT and the output IDT, and the two shield electrodes are substantially symmetrical about a central line between them and perpendicular to the SAW propagation path.

8. A SAW device as claimed in claim 5 wherein each SAW filter further includes a second shield electrode between the input IDT and the output IDT, and the two shield electrodes are substantially symmetrical about a central line between them and perpendicular to the SAW propagation path.

9. A SAW (surface wave) device comprising:
   a first input IDT (inter-digital transducer) and a first output IDT forming a first SAW filter, at least one of the IDTs of the first SAW filter having a slanted finger geometry for SAWs at a plurality of different wavelengths over an aperture of the IDT; and
   a second SAW filter comprising a second input IDT and a second output IDT;
   wherein the second SAW filter is similar to the first SAW filter except that it provides a 180 degree phase chance, relative to the first SAW filter, for SAWs regenerated at the output IDT and returned to the input IDT, said 180 degree phase change being provided respectively for said plurality of different wavelengths;
   the second input IDT being connected in parallel with the first input IDT so that said regenerated SAWs substantially cancel one another at the input IDTs for said plurality of wavelengths over said aperture;
   wherein each SAW filter includes a shield electrode between the input IDT and the output IDT, and at least one edge of said shield electrode is slanted or stepped so that SAW reflections at said edge from different positions across the aperture have substantially 180 degree phase differences between them, whereby said reflections are substantially cancelled at said plurality of different wavelengths, a slant or step size of said edge varying in dependence upon the SAW wavelength across said aperture.

10. A SAW device as claimed in claim 9 wherein said at least one edge of said shield electrode is stepped across the aperture with adjacent steps being displaced from one another, in the direction of SAW propagation, by about one quarter of the SAW wavelength, or an odd multiple thereof, at each respective one of the steps.

11. A SAW device as claimed in claim 10 wherein each SAW filter further includes a second shield electrode between the input IDT and the output IDT, and the two shield electrodes are substantially symmetrical about a central line between them and perpendicular to the SAW propagation path.

12. A SAW device as claimed in claim 9 wherein each SAW filter further includes a second shield electrode between the input IDT and the output IDT, and the two shield electrodes are substantially symmetrical about a central line between them and perpendicular to the SAW propagation path.

* * * * *

UNITED STATES PATENT AND TRADEMARK OFFICE
CERTIFICATE OF CORRECTION

PATENT NO. : 6,856,214 B2
DATED : February 15, 2005
INVENTOR(S) : Chun-Yun Jian et al.

It is certified that error appears in the above-identified patent and that said Letters Patent is hereby corrected as shown below:

Column 10,
Line 20, the word "...chance..." should read -- ...change... --

Signed and Sealed this

Twelfth Day of July, 2005

JON W. DUDAS
*Director of the United States Patent and Trademark Office*